(12) United States Patent
Tanabe

(10) Patent No.: US 7,442,995 B2
(45) Date of Patent: Oct. 28, 2008

(54) SEMICONDUCTOR DEVICE AND METHOD OF MANUFACTURING THE SAME

(75) Inventor: Ryo Tanabe, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 162 days.

(21) Appl. No.: 11/190,967

(22) Filed: Jul. 28, 2005

(65) Prior Publication Data

US 2006/0223272 A1 Oct. 5, 2006

(30) Foreign Application Priority Data

Mar. 29, 2005 (JP) ............................. 2005-096093

(51) Int. Cl.
*H01L 27/088* (2006.01)
*H01L 27/092* (2006.01)

(52) U.S. Cl. ............... 257/368; 257/369; 257/506; 257/E27.06

(58) Field of Classification Search ............ 438/424; 257/288, 327, 336, 337, 338, 344, 346, 351, 257/368, 369, 408, 506, E27.06, E27.062
See application file for complete search history.

(56) References Cited

U.S. PATENT DOCUMENTS

| | | | | |
|---|---|---|---|---|
| 6,133,105 A * | 10/2000 | Chen et al. | .................. | 438/296 |
| 6,146,970 A * | 11/2000 | Witek et al. | .................. | 438/424 |
| 6,165,871 A * | 12/2000 | Lim et al. | .................... | 438/437 |
| 6,509,232 B1 * | 1/2003 | Kim et al. | .................... | 438/264 |
| 6,551,901 B1 * | 4/2003 | Gu et al. | ...................... | 438/424 |
| 6,649,489 B1 * | 11/2003 | Chang et al. | ................ | 438/424 |
| 6,682,985 B2 * | 1/2004 | Yuzuriha et al. | ........... | 438/425 |
| 6,716,691 B1 * | 4/2004 | Evans et al. | ................. | 438/218 |
| 6,770,539 B2 * | 8/2004 | Sumida | ....................... | 438/302 |
| 6,797,587 B1 * | 9/2004 | Yang et al. | .................. | 438/424 |
| 6,828,209 B1 * | 12/2004 | Maruo | ......................... | 438/424 |
| 6,855,615 B2 * | 2/2005 | Komori | ....................... | 438/424 |
| 6,884,667 B1 * | 4/2005 | Doris et al. | ................. | 438/164 |
| 6,893,937 B1 * | 5/2005 | Gu et al. | ..................... | 438/424 |
| 6,919,612 B2 * | 7/2005 | Clampitt et al. | ............ | 257/508 |
| 6,958,280 B2 * | 10/2005 | Kim | ........................... | 438/401 |
| 6,958,518 B2 * | 10/2005 | Wylie | ......................... | 257/395 |
| 6,979,627 B2 * | 12/2005 | Yeap et al. | .................. | 438/424 |
| 7,018,886 B2 * | 3/2006 | Chi | ............................. | 438/221 |
| 7,029,988 B2 * | 4/2006 | Ohnishi et al. | ............. | 438/424 |
| 7,238,564 B2 * | 7/2007 | Ko et al. | ..................... | 438/221 |
| 2001/0026980 A1 * | 10/2001 | Mizuo | ....................... | 438/296 |

(Continued)

OTHER PUBLICATIONS

Patent Abstracts of Japan, Publication No. 2000022141, dated Jan. 21, 2000.

(Continued)

*Primary Examiner*—M. Wilczewski
(74) *Attorney, Agent, or Firm*—Westerman, Hattori, Daniels & Adrian, LLP.

(57) ABSTRACT

Each of channel regions 2a and 3b is covered by a gate electrode 6 via a gate insulation film 5 and side wall spacers 9 from its top face to both side faces along an x-direction. In other words, there is no insulation material of an STI element isolation structure 4 on both side faces along the x-direction of each of the channel regions 2b and 3b (in a non-contact state), thereby preventing stress in a z-direction from being applied by the STI element isolation structure 4 to each of the channel region 2b and 2b.

6 Claims, 8 Drawing Sheets

U.S. PATENT DOCUMENTS

2002/0064912 A1*  5/2002  Komori .................. 438/221
2004/0256674 A1   12/2004 Sanuki
2005/0224907 A1* 10/2005  Ko et al. ................ 257/506

OTHER PUBLICATIONS

Patent Abstracts of Japan, Publication No. 2004055640, dated Feb. 19, 2004.

Yukihiro Kumagai et al.; "Evaluation of change in drain current due to strain in 0.13-µm-node MOSFETs", International Conference on Solid State Devices and Materials, Nagoya, 2002.

Chinese Office Action dated Mar. 14, 2008, issued in corresponding Chinese Application No. 200510091422.5.

* cited by examiner

FIG. 1A

DIRECTION OF STRAIN TO INCREASE ON-CURRENT (TABLE 1)

|  | <110> CHANNEL | |
|---|---|---|
|  | nMOS | pMOS |
| x (GATE-LENGTH DIRECTION) | EXPANSION | COMPRESSION |
| y (DEPTH DIRECTION) | COMPRESSION | EXPANSION |
| z (GATE-WIDTH DIRECTION) | EXPANSION | EXPANSION |

FIG. 1B

CALCULATION FORMULA OF CHANGE
IN CURRENT DUE TO STRAIN IN NMOS AND PMOS (FORMULA 1)

$$\Delta I_{on\_N} = 5200^* \varepsilon_{xx} - 9700^* \varepsilon_{yy} + 2200^* \varepsilon_{zz}$$
$$\Delta I_{on\_P} = -7400^* \varepsilon_{xx} + 8200^* \varepsilon_{yy} + 8300^* \varepsilon_{zz}$$

FIG. 2
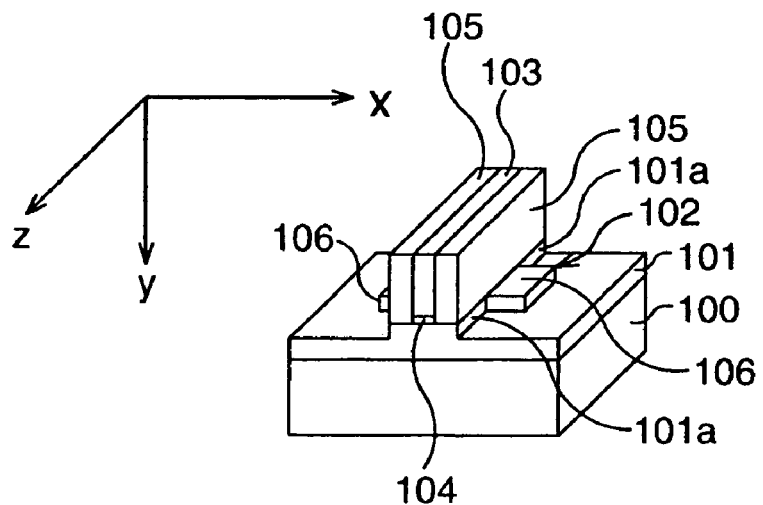
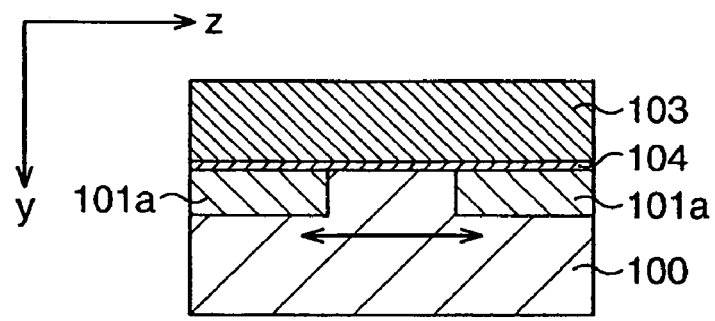
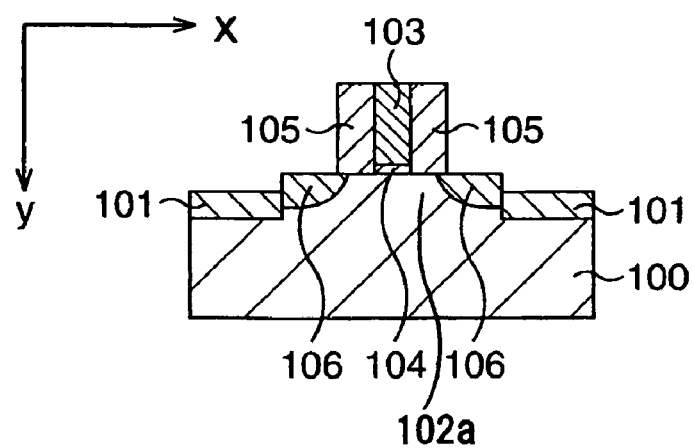

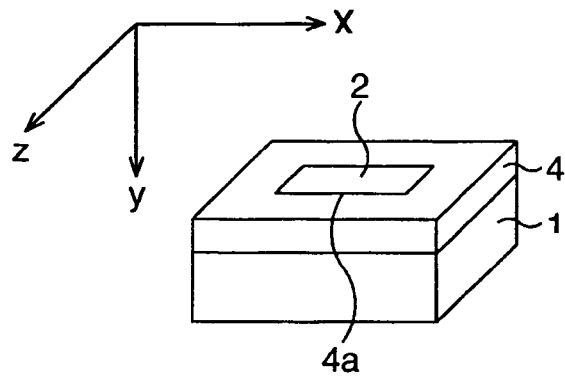
FIG. 3A
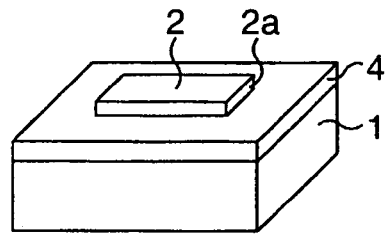
FIG. 3B
FIG. 3C
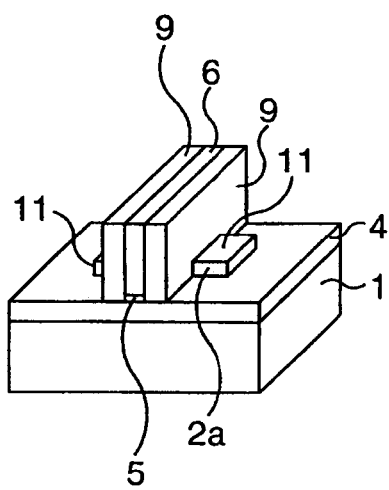
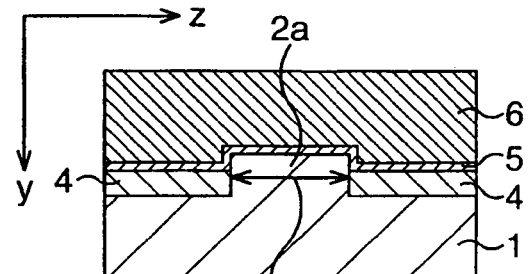
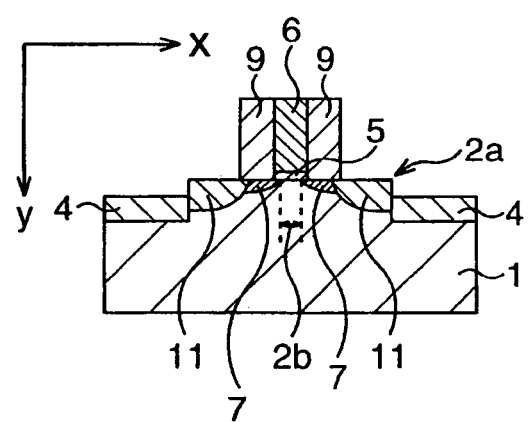

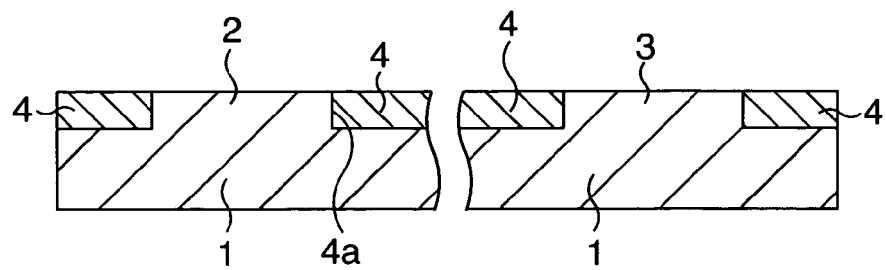
FIG. 4A
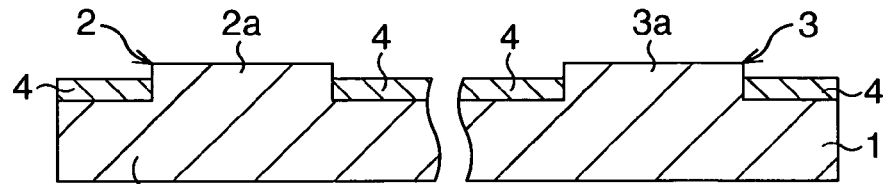
FIG. 4B
FIG. 4C
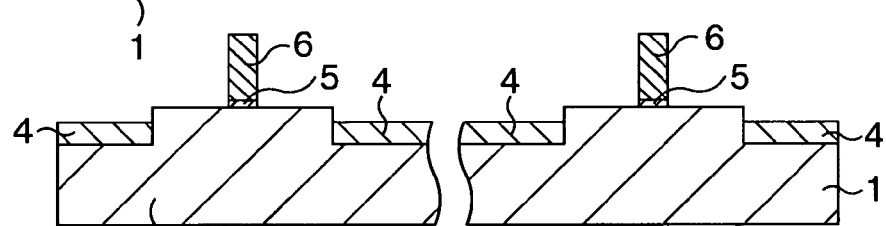
FIG. 4D
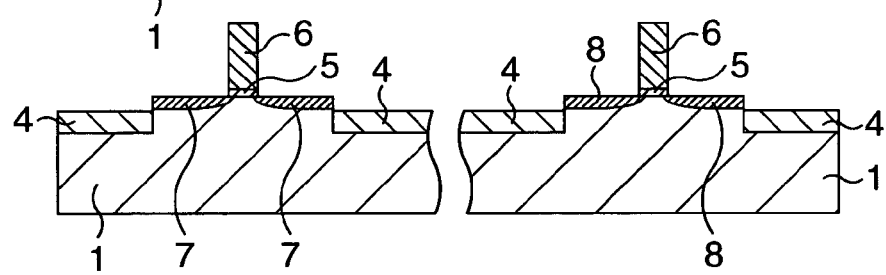
FIG. 4E
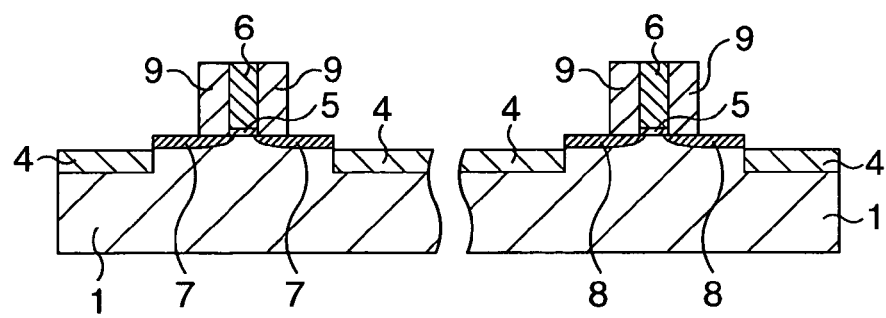
FIG. 4F
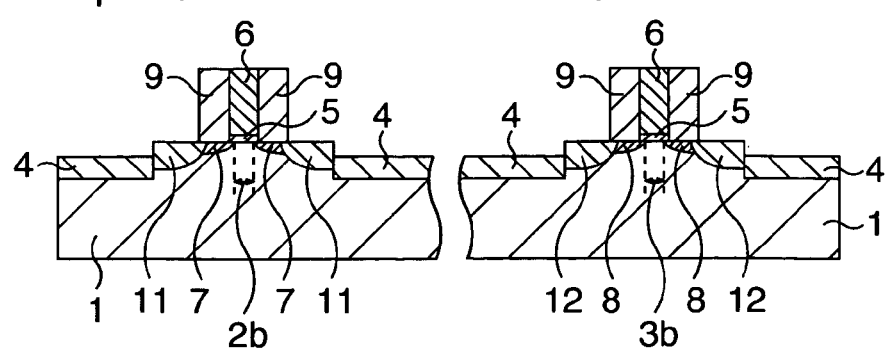

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2005-096093, filed on Mar. 29, 2005, the entire contents of which are incorporated herein by reference.

BACKGROUND OF THE INVENTION

1. Field of the Invention

The present invention relates to a semiconductor device having an element isolation structure by the STI (Shallow Trench Isolation) method and a method of manufacturing the same.

2. Description of the Related Art

Conventionally, as an element isolation structure, an element isolation structure formed by the STI method (hereinafter, simply referred to as an STI element isolation structure) has been used in which insulation within an active region is ensured by embedding an insulation material in a groove formed within the element isolation region. This STI element isolation structure is expected to contribute to demands for miniaturization of semiconductor devices in recent years because it can ensure element isolation unlike a field oxide film or the like protruding from the substrate surface formed by a so-called LOCOS method.

(Patent Document 1) Japanese Patent Application Laid-open No. 2000-22141

(Patent Document 2) Japanese Patent Application Laid-open No. 2004-55640

(Non-Patent Document 1) Y. Kumagai et al., "Evaluation of change in drain current due to strain in 0.13-µm-node MOSFETs", SSDM, pp. 14-15, 2003.

SUMMARY OF THE INVENTION

However, the use of the STI element isolation structure suffers from a decrease in on-current due to stress on the active region applied from the STI element isolation structure.

Hence, the following technique has been proposed as a technique to relieve the stress applied to the active region.

For the N-type MOS transistor, a method is employed which forms the gate electrode of a material and on a condition that the gate electrode applies expansion strain to the active region at a lower layer, or the like. On the other hand, for the P-type MOS transistor, a method is employed which forms the source/drain region using SiGe to increase the absolute value of current passing through the channel region or the like.

In this case, however, the N-type MOS transistor and the P-type MOS transistor are formed by different processes, thus necessarily leading to increase in processes and complication of processes, and in addition, they need to be formed using materials which have not conventionally been used, to encounter many difficulties in technique and manufacturing cost for realization.

In addition, when the STI element isolation structure is used, the stress caused by the STI element isolation structure exhibits different value greatly depending on the width (the gate-width direction), the length (the gate-length direction), and so on of the active region, especially on the width. As a concrete example, the relationship between the active region width (W (nm)) and the variation in the on-current ($\Delta I_{on}$ (%)) in the N-type and P-type MOS transistors using the STI element isolation structure is shown in FIG. 8. The case of $\Delta I_{on}$ being 0% represents the state in which the channel region is not strained at all, that is, the state in which the stress is completely released. As shown in the drawing, in both the N-type and P-type MOS transistors, as the gate width is decreased, the influence of the stress by the STI element isolation structure increases (when both of them are compared, the P-type MOS transistor is influenced by the stress more greatly than the N-type MOS transistor) and the on-current decreases. As described above, especially the dependence on the active region width for the on-current (hereinafter, referred to as the gate-width direction dependence) becomes more serious as the device is miniaturized further. The problem of the gate-width direction dependence cannot be solved even when the above-described methods are applied to the case using the STI element isolation structure.

As countermeasures against the problem specialized for the STI element isolation structure, for example, approaches are made, such as an approach of seeking a new material applying less stress as the insulation material of the STI element isolation structure, an approach of forming a buffer material film referred to as a liner in a groove of the STI element isolation structure to relieve the stress, and so on. This case, however, also requires a material which has not conventionally been used. In addition, the change of the insulation material of the STI element isolation structure or the insertion of the liner is far from sufficiently relieving from the stress.

As described above, when the STI element isolation structure is used, a device structure with less gate-width direction dependence of the stress is demanded to relieve the stress applied to the active region and efficiently reduce the stress, in order to improve the on-current. Presently, a technology is being sought which easily and surely meets these two demands without causing an increase in processes and complication of processes.

The present invention has been developed in consideration of the above problems and its object is to provide a reliable semiconductor device having excellent current characteristics in a semiconductor device including the STI element isolation structure in which the gate-width direction dependence of the stress is significantly reduced and the stress applied to the active regions is relieved easily and surely without causing an increase in processes and complication of processes, and a method of manufacturing the same.

A semiconductor device of the present invention, includes: an element isolation structure formed by embedding an insulation material in a groove formed within an element isolation region of a semiconductor substrate; an active region defined in the semiconductor substrate by the element isolation structure; a gate electrode pattern-formed above the active region via a gate insulation film; and a transistor structure having a pair of impurity diffused layers formed within the active region on both sides of the gate electrode, wherein the element isolation structure is in a non-contact state with at least both side faces along a gate-length direction of a channel region constituting a substantial current passing region formed between the impurity diffused layers within the active region.

A method of manufacturing a semiconductor device of the present invention, includes the steps of: forming a groove within an element isolation region of a semiconductor substrate; embedding an insulation material in the groove to form an element isolation structure to thereby define an active region on the semiconductor substrate; partially removing the insulation material of the element isolation structure to expose a surface layer portion of the active region; pattern-forming a gate electrode in such a manner as to cover the surface layer portion from a top face to both side faces thereof via a gate insulation film; and introducing impurities into the active region on both sides of the gate electrode to form a pair of impurity diffused layers.

A method of manufacturing a semiconductor device of the present invention, includes the steps of: forming a groove within an element isolation region of a semiconductor substrate; embedding an insulation material in the groove to form an element isolation structure to thereby define an active region on the semiconductor substrate in a shape having protruding portions protruding from a pair of side faces of a rectangle respectively; pattern-forming a gate electrode in a shape extending along tops of the protruding portions via a gate insulation film above the active region; and introducing impurities into the active region on both sides of the gate electrode to form a pair of impurity diffused layers.

BRIEF DESCRIPTION OF THE DRAWINGS

FIGS. 1A and 1B are a table and a formula each showing strains required to increase the on-current in a channel region taking N-type and P-type MOS transistors as models;

FIG. 2 is a schematic perspective view showing a configuration of a MOS transistor having a typical STI element isolation structure;

FIGS. 3A to 3C are schematic views showing main processes in a method of manufacturing a CMOS transistor according to a first embodiment selected only for the P-type MOS transistor;

FIGS. 4A to 4F are schematic cross-sectional views showing the method of manufacturing the CMOS transistor according to the first embodiment in the order of processes;

DETAILED DESCRIPTION OF THE PREFERRED EMBODIMENTS

Basic Gist of Present Invention

Figure 5A:
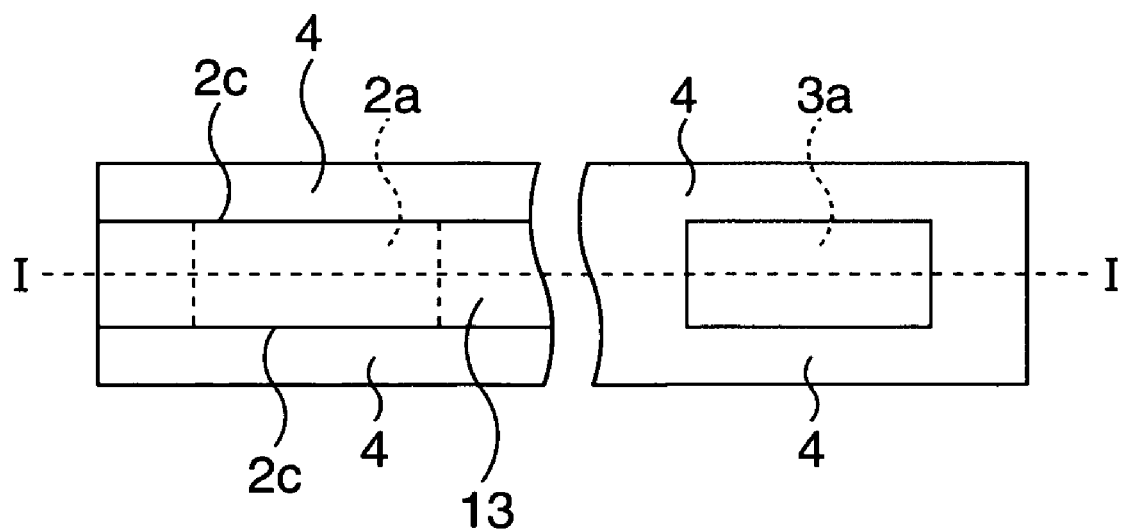
FIGS. 5A and 5B are schematic views showing processes added to the first embodiment in a modification example of the first embodiment.

FIGS. 1A and 1B show strains required to increase the on-current in a channel region taking N-type and P-type MOS transistors as models. FIG. 1A is a table showing signs representing strains (compression or expansion) in x-, y-, and z-directions, which are required to increase the on-current within the channel region for <110> which is a usually used plane azimuth of a semiconductor substrate (see Non-Patent Document 1). Further, FIG. 1B is a calculation formula showing the relationship between the change in current and the strain in these models. $\epsilon_{xx}$, $\epsilon_{yy}$, and $\epsilon_{zz}$ represent here strains in the x-, y-, and z-directions respectively, and $\Delta I_{onN}$ and $\Delta I_{onP}$ represent variation values in the on-current in the N-type MOS transistor and the P-type MOS transistor, respectively.

Here, the N-type transistor and the P-type transistor have opposite signs of strains to increase the on-current in the x-direction (a channel-length direction) and the y-direction (a substrate-depth direction), but they have the same sign of strains in the z-direction (a channel-width direction). The present inventors pay attention to the strain in the z-direction showing the same properties both in the N-type transistor and the P-type transistor, and positively engineer the stress in the z-direction. This enables relief of the compression stress which deteriorates the on-current to improve the performance and to restrain the gate-width direction dependence of the device at the same time in both the N-type and P-type MOS transistors.

A MOS transistor having the STI element isolation structure usually takes the configuration as shown in FIG. 2. FIG. 2 shows a schematic perspective view of the MOS transistor and schematic cross-sectional views along a z-y plane and an x-y plane of the MOS transistor. Here, a numeral 101 denotes an STI element isolation structure formed within an element isolation region of a silicon substrate 100, a numeral 102 denotes an active region defined by the STI element isolation structure 101, a numeral 103 denotes a gate electrode pattern-formed above the active region 102 via a gate insulation film 104, a numeral 105 denotes a side wall spacer formed on either side of the gate electrode, and a numeral 106 denotes a source/drain region being either side portion of the side wall spacer 105 within the active region 102. Incidentally, a shallow extension region may be formed which partially overlaps with the source/drain region 106.

The STI element isolation structure 101 is formed such that an insulation material is filled in a groove formed within the element isolation region and its surface is flattened, and then its surface layer is slightly removed from the above state under the influence of etching in the formation of the side wall spacers 105, thereby exposing the surface layer of the active region 102. However, the insulation material of the STI element isolation structure 101 remains within portions in contact with both side faces along the x-direction within a channel region 102a between the source/drain regions 106 of the active region 102 (between extension regions if they are formed), because the gate electrode 103 and the side wall spacers 105 extending from above the channel region 102a serve as a so-called mask. The remaining portions are represented by numerals 101a.

Figure 8:
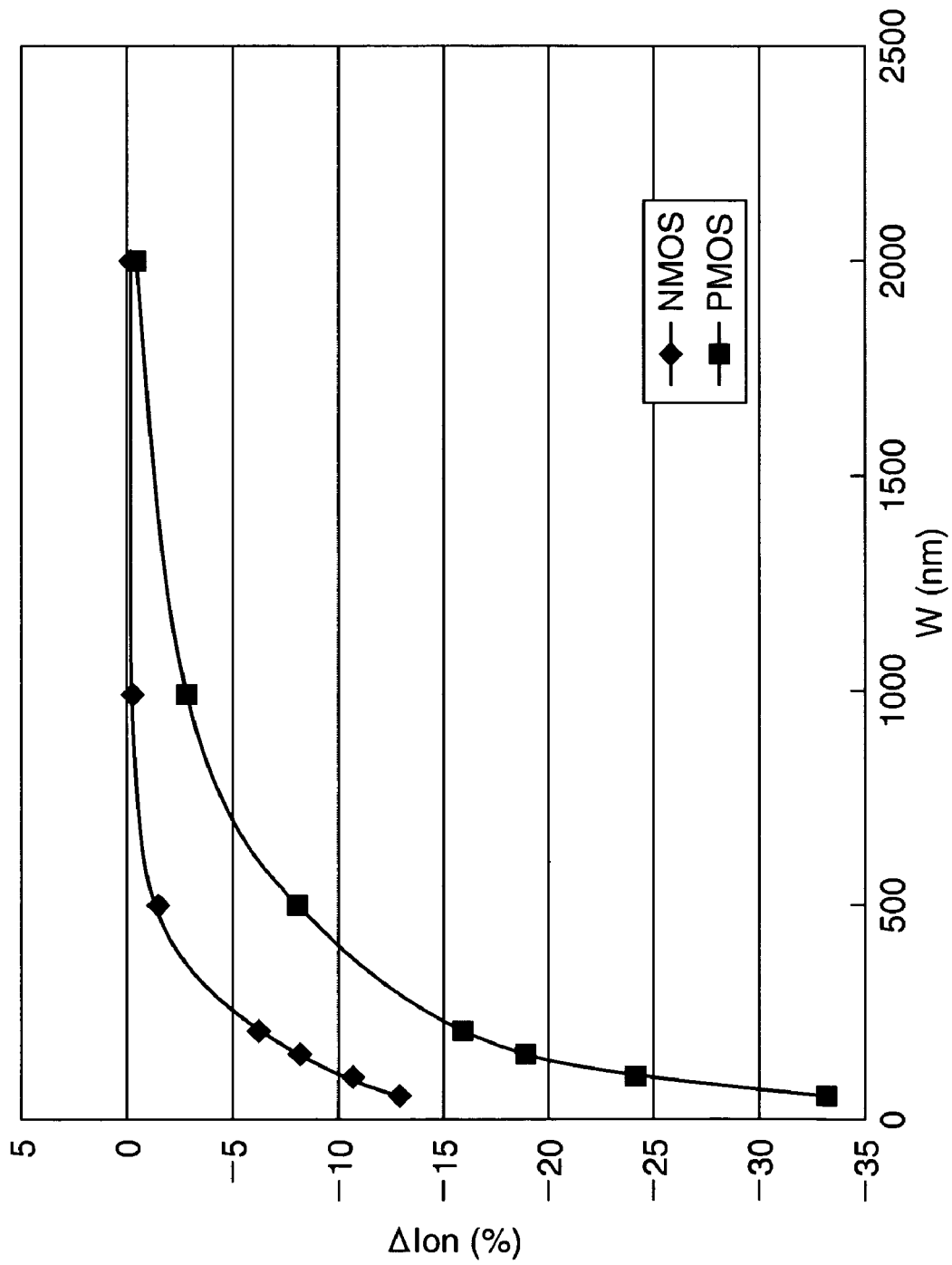
FIG. 8 is a characteristic diagram showing the relationship between the width of an active region and variation in on-current in the N-type and the P-type MOS transistors using the STI element isolation structure.

The remaining portions 101a are formed in a manner to hold the channel region 102a therebetween in the z-direction, so as to apply compression stress in the z-direction to the channel region 102a. Accordingly, it is only required to relieve the compression stress in the z-direction against the channel region 102a applied by the remaining portions 101a. In the present invention, the STI element isolation structures 101 like the remaining portions 101a are formed such that their insulation materials are not in contact with at least both side faces along the x-direction of the channel region 102a. In particular, as will be described in greater detail in the following embodiments, there are conceivable configurations such as one in which the remaining portions 101a are removed before the formation of the gate electrode 103 and one in which the remaining portions 101a are separated from the channel region 102a constituting an actual current passing region between the source/drain regions 106. Such a configuration is employed to relieve the compression stress in the z-direction. In addition, in this case, the relief of the compression stress in the z-direction, that is, the gate-width direction also decreases the gate-width direction dependence to restore the decreased amount of the on-current as shown in the characteristic diagram in FIG. 8, thus allowing devices to be miniaturized further without a loss of the on-current. In other words, according to the present invention, the gate-width direction dependence can be significantly reduced to prevent a decrease in the on-current both in the N-type and P-type MOS transistors irrespective of the conduction type thereof.

It should be noted that, as shown in the calculation formula in FIG. 1B, the coefficient of $\epsilon_{zz}$ in $\Delta I_{onP}$ is about four times as large as that in $\Delta I_{onN}$, representing that a strain in the z-direction more greatly contributes to the variation in the on-current. Accordingly, the present invention offers a great effect especially for the P-type MOS transistor, as well as for the N-type MOS transistor.

Incidentally, as disclosed in Patent Documents 1 and 2, there are techniques to restrain the threshold voltage, retrain the parasitic transistor, or the like by devising the form or the like of the STI element isolation structure in the MOS transistor having the STI element isolation structure, but there is no disclosure nor teaching on an STI element isolation structure having the form in the present invention for the purpose of relieving the stress within the channel region.

Embodiments to which the Present Invention Applied

Hereinafter, concrete embodiments in which the present invention is applied to a CMOS transistor will be described in detail with reference to the drawings. Note that the configuration of the CMOS transistor will be described in conjunction with its manufacturing method for convenience of explanation.

First Embodiment

FIGS. 3A to 3C are schematic perspective views showing main processes in a method of manufacturing a CMOS transistor according to the first embodiment selected only for the P-type MOS transistor, and FIG. 3C that is a completion view of the P-type MOS transistor additionally shows schematic cross-sectional views along a z-y plane and an x-y plane of the transistor. FIGS. 4A to 4F are schematic cross-sectional views showing the method of manufacturing the CMOS transistor according to the first embodiment in the order of processes, each view corresponding to a schematic cross section along the x-y plane shown in FIG. 3C.

First, as shown in FIG. 3A and FIG. 4A, on a silicon substrate 1, an active region 2 of the P-type MOS transistor and an active region 3 of the N-type MOS transistor are defined, respectively.

More specifically, element isolation structures are formed respectively within the element isolation region for the P-type MOS transistor and the element isolation region for the N-type MOS transistor on a semiconductor substrate, that is, the silicon substrate 1, so as to define the active regions 2 and 3 in a rectangular shape. As the element isolation structures, the STI method is used to fill grooves 4a, which are formed within the element isolation regions by lithography and dry etching, with an insulation material such as a silicon oxide or the like, and then, for example, the CMP (Chemical Mechanical Polishing) method is used to polish for flattening the surface of the insulation material to form STI element isolation structures 4.

Subsequently, as shown in FIG. 3B and FIG. 4B, surface layers 2a and 3a of the active regions 2 and 3 are exposed, respectively.

More specifically, an etching solution selectively removing the insulation material of the STI element isolation structures 4, for example, an HF solution or the like is used to wet-etch the surface layer of the insulation material of the STI element isolation structures 4 for removal. This wet-etching exposes the surface layers 2a and 3a of the active regions 2 and 3 in a thickness of, for example, about 30 nm respectively. As will be described later, in the surface layers 2a and 3a, channel regions will be formed.

Subsequently, as shown in FIG. 4C, gate electrodes 6 are pattern-formed which extend from above the surface layers 2a and 3a of the active regions 2 and 3 via gate insulation films 5 to the STI element isolation structures 4.

More specifically, first, the gate insulation film 5 having a film thickness of about 1 nm made of, for example, a silicon oxide film is formed on the active regions 2 and 3 by, for example, the thermal oxidation method.

Next, a polycrystalline silicon film (not shown) is deposited to have a film thickness of about 100 nm on the entire surface including the gate insulation film 5 by, for example, the CVD method. Then, the polycrystalline silicon film and the gate insulation film 5 are patterned by the lithography and the dry etching, thereby pattern-forming the gate electrodes 6 each covering the top face and both side faces of each of the surface layers 2a and 3a of the active regions 2 and 3 and extending over the STI element isolation structures 4, respectively.

It is also preferable to form the gate electrodes 6 on a condition that when the gate electrodes 6 are formed, the gate electrodes 6 relieve the compression stress applied to the portions which will become the active regions 2 and 3 or apply expansion stress to the portions. For example, when the polycrystalline silicon film becoming the gate electrodes 6 is formed, it is formed at a temperature of, for example, 700° C. to 1000° C., for example, 850° C. The formation of the gate electrodes 6 in the above manner relieves the compression stress applied to the portions becoming the channel regions (or applies expansion stress to the portions), thereby further contributing to the improvement in the on-current.

Subsequently, as shown in FIG. 4D, extension regions 7 and extension regions 8 are formed within the active regions 2 of the P-MOS transistor and the active region 3 of the N-type MOS transistor, respectively.

More specifically, first, a resist mask (not shown) is formed which covers only the active region 3 side, and ion implantation of P-type impurities, boron (B) here is performed to the active region 2 on a condition of an acceleration energy of 1 keV and a dose amount of $1\times10^{15}/cm^2$. During the implantation, the P-type extension regions 7 are formed on both sides of the gate electrode 6 with the gate electrode 6 serving as a mask within the active region 2.

Next, after the resist mask is removed by ashing or the like, a resist mask (not shown) is formed which covers only the active region 2 side. Then, using this resist mask, ion implantation of N-type impurities, phosphor (P) here is performed to the active region 3 on a condition of an acceleration energy of 1 keV and a dose amount of $2\times10^{15}/cm^2$. During the implantation, the N-type extension regions 8 are formed on both sides of the gate electrode 6 with the gate electrode 6 serving as a mask within the active region 3. The resist mask is then removed by ashing or the like.

Subsequently, as shown in FIG. 4E, side wall spacers 9 are formed on both side faces of each of the gate electrodes 6.

More specifically, an insulation film, a silicon oxide film (not shown) here is deposited on the entire surface to cover the gate electrodes 6. Anisotropic etching (etch back) is then performed for the entire surface of the silicon oxide film to leave the silicon oxide film only on both side faces of the gate electrodes 6, thereby forming the side wall spacers 9, respectively.

Subsequently, as shown in FIG. 3C and FIG. 4F, source/drain regions 11 and source/drain regions 12 are formed within the active region 2 of the P-type MOS transistor and the active region 3 of the N-type MOS transistor, respectively.

More specifically, first, a resist mask (not shown) is formed which covers the active region 3 side, and ion implantation of P-type impurities, boron (B) here is performed to the active region 2 on a condition of an acceleration energy of 40 keV and a dose amount of $5 \times 10^{15}/cm^2$. During the implantation, the P-type source/drain regions 11 which are deeper than the extension regions 7 are formed, in a manner to partially overlap with the P-type extension regions 7, on both sides of the side wall spacers 9 with the gate electrode 6 and the side wall spaces 9 serving as a mask within the active region 2.

Next, after the resist mask is removed by ashing or the like, a resist mask (not shown) is formed which covers the active region 2 side. Using this resist mask, ion implantation of N-type impurities, phosphor (P) here is performed to the active region 3 on a condition of an acceleration energy of 40 keV and a dose amount of $5 \times 10^{15}/cm^2$. During the implantation, the N-type source/drain regions 12 which are deeper than the extension regions 8 are formed, in a manner to partially overlap with the N-type extension regions 8, on both sides of the side wall spacers 9 with the gate electrode 6 and the side wall spaces 9 serving as a mask within the active region 3.

Then, after the resist mask is removed by ashing or the like, annealing processing is performed for the silicon substrate 1 at 1050° C. for about 10 seconds. This annealing processing activates the various impurities ion-implanted for the formation of the extension regions 7 and 8 and the source/drain regions 11 and 12.

Thereafter, through formation of an interlayer insulation film, various connection holes, wirings and so on, a CMOS transistor including the P-type MOS transistor within the active region 2 and the N-type MOS transistor within the active region 3 is completed.

In this embodiment, as shown in FIG. 3C, the rectangular region between the extension regions 7 becomes a channel region 2*b* within the active region 2, and the rectangular region between the extension regions 8 becomes a channel region 3*b* within the active region 3. Each of the channel regions 2*b* and 3*b* is covered by the gate electrode 6 via the gate insulation film 5 and the side wall spacers 9 starting from its top face to the both side faces along the x-direction. In other words, there is no insulation material of the STI element isolation structure 4 on both side faces along the x-direction of each of the channel regions 2*b* and 3*b* (in a non-contact state), thereby accordingly preventing stress in the z-direction from the STI element isolation structure 4 from being applied to each of the channel regions 2*b* and 3*b*. In this case, they are hardly affected by restraint by the gate-width direction dependence. This configuration can prevent a decrease in the on-current both in the P-type and the N-type MOS transistors, with little or no gate-width direction dependence and irrespective of the conduction type thereof.

As described above, according to this embodiment, it is possible to significantly reduce the gate-width direction dependence of the stress and relieve the stress applied to the active regions easily and surely, without causing an increase in processes and complication of processes in a CMOS transistor including the STI element isolation structures 4, so as to realize a reliable CMOS transistor having excellent current characteristics.

Modification Example

Here, a modification example of the first embodiment will be described. In this modification example, a CMOS transistor is manufactured as in the first embodiment, but is different in that a process is added which relieves the stress of the STI element isolation structure 4 by introduction of an element.

Figure 5B:
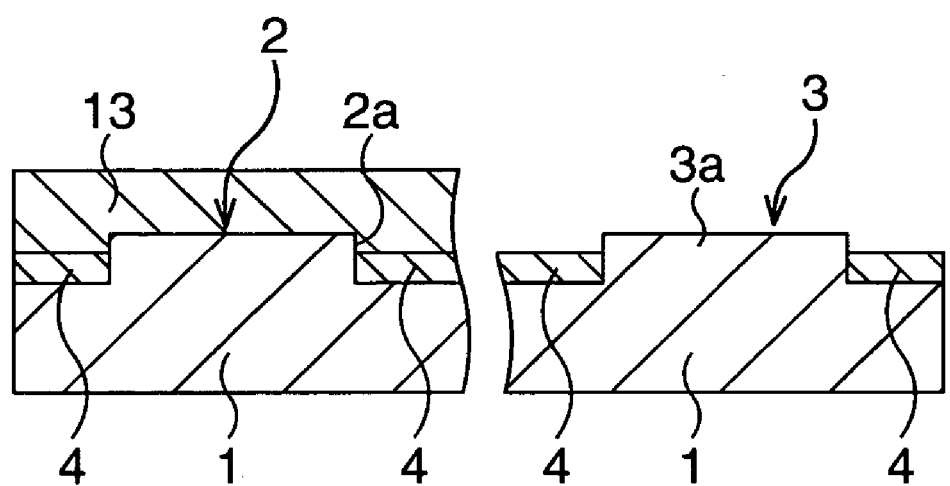

FIGS. 5A and 5B are schematic views showing processes added to the first embodiment in this modification example, and FIG. 5A is a schematic plan view and FIG. 5B is a schematic cross-sectional view along a broken line I-I in FIG. 5A.

First, processes in FIGS. 4A and 4B (FIGS. 3A and 3B) are performed.

Subsequently, as shown in FIGS. 5A and 5B, a resist mask 13 covering the active region 2 and extending in the x-direction is formed only within the active region 2 for the P-type MOS transistor.

More specifically, a resist is applied over the entire surface and processed by lithography to thereby form the resist mask 13 only on the active region 2 side which covers the active region 2 and extends over the STI element isolation structure 4, with an almost the same width as that of the active region 2 in the z-direction. Both side faces along the z-direction of the active region 2 are covered by the resist mask 13 here, whereas both side faces along the x-direction of the active region 2 are not covered by the resist mask 13 but exposed.

Then, in the state shown in FIGS. 5A and 5B, ion-implantation into the surface layer of the STI element isolation structure 4 is performed using a relatively heavy element such as Ge, Si or the like, Ge here. On the active region 2 side, ion implantation of Ge is performed to portions exposed by the resist mask 13 of the STI element isolation structure 4, that is, portions in contact with both end faces 2*c* along the x-direction of the active region 2 (regions R surrounded by the broken line in the drawing) are made amorphous by the ion implantation of Ge. On the other hand, on the active region 3 side, the ion implantation of Ge is performed to the entire surface of the STI element isolation structure 4.

It should be noted that although the active region 3 is made amorphous by the above-described ion implantation of Ge, it is re-crystallized by the later-described annealing processing, thus causing no problem. As a matter of course, it is also possible to form a resist mask covering only the active region 3 together with the resist mask 13, thereby preventing Ge from entering the active region 3.

Subsequently, processes of FIGS. 4C to 4F (FIG. 3C) are performed.

Then, after the resist mask is removed by ashing or the like, annealing processing is performed for the silicon substrate 1 at 1050° C. for about 10 seconds. This annealing processing activates the various impurities ion-implanted for the formation of the extension regions 7 and 8 and the source/drain regions 11 and 12. At this time, the annealing processing relieves the compression stress applied by the STI element isolation structures 4 to the active regions 2 and 3. In other words, on the active region 2 side, the compression stress in the z-direction is relieved which is applied by the regions R to both end faces 2*c* of the active region 2. On the other hand, on the active region 3 side, the compression stress is relieved which is applied by the STI element isolation structure 4 to four end faces of the active regions 3, that is, both end faces along the x-direction and both end faces along the z-direction.

To increase the on-current, it is only required here to apply compression stress in the x-direction and expansion stress in the z-direction for the P-type MOS transistor as shown in FIG. 1. Conversely, for the N-type MOS transistor, it is only required to apply expansion stress both in the x-direction and the z-direction. In this modification example, the above-described re-crystallization applies compression stress in the x-direction and expansion stress in the z-direction within the active region 2 of the P-type MOS transistor, and applies expansion stress both in the x-direction and the z-direction within the active region 3 of the N-type MOS transistor. This increases the on-current on the best condition for each of the P-type and N-type MOS transistors, respectively.

Thereafter, through formation of an interlayer insulation film, various connection holes, wirings and so on, a CMOS transistor including the P-type MOS transistor within the active region 2 and the N-type MOS transistor within the active region 3 is completed.

As described above, according to this modification example, it is possible to significantly reduce the gate-width direction dependence of the stress and relieve the stress applied to the active regions easily and surely on the respective optimum conditions for the P-type and N-type MOS transistors, in a CMOS transistor including the STI element isolation structures 4, in order to realize a reliable CMOS transistor having excellent current characteristics.

Second Embodiment

Figure 6A:
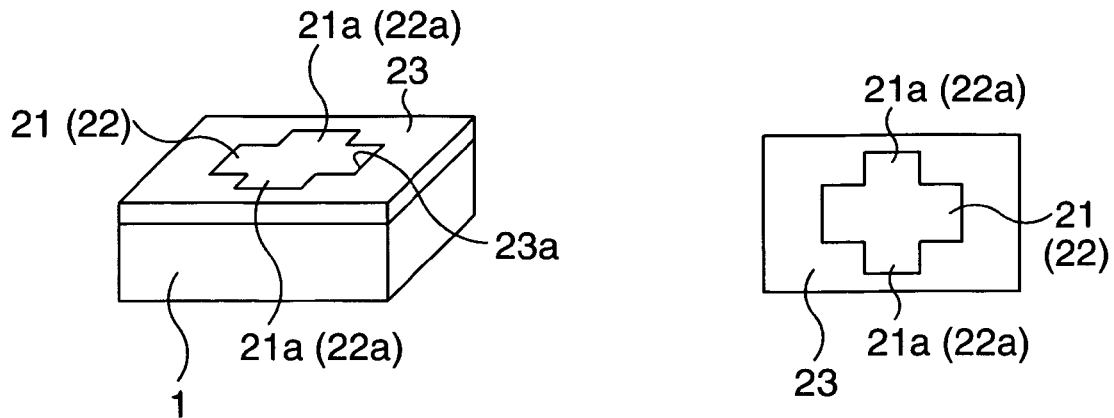
FIGS. 6A to 6C are schematic views showing main processes in a method of manufacturing a CMOS transistor according to a second embodiment selected only for the P-type MOS transistor.
Figure 6B:
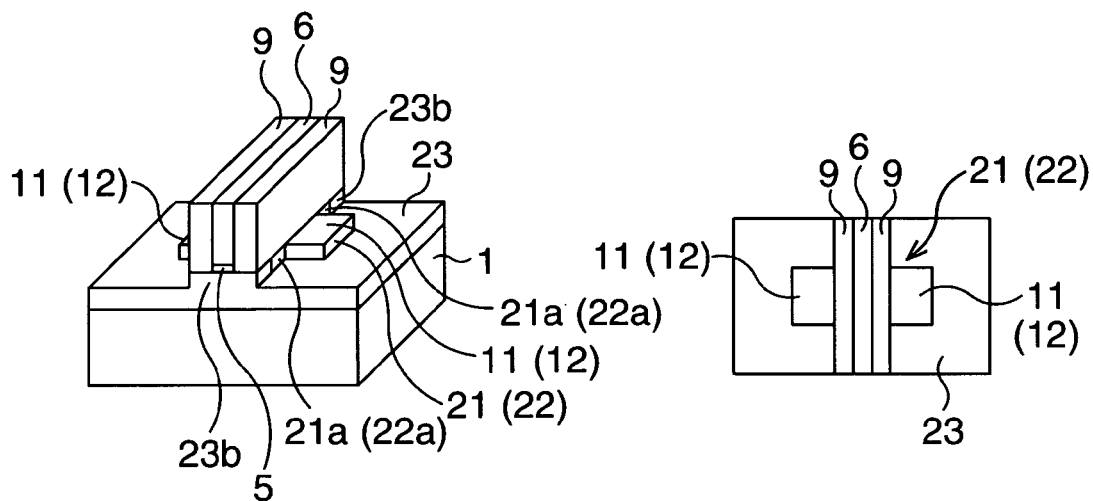
Figure 6C:
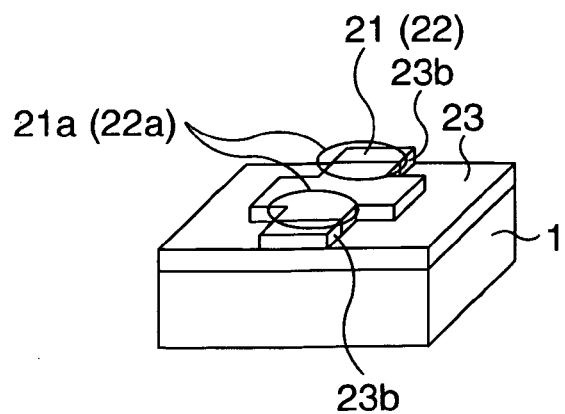

FIGS. 6A to 6C are schematic views showing main processes in a method of manufacturing a CMOS transistor according to the second embodiment selected only for the P-type MOS transistor. The left drawing is a schematic perspective view and the right drawing is a schematic plan view in each of FIGS. 6A and 6B, and FIG. 6C illustrates a schematic plan view of a completion view of the P-type MOS transistor showing the state in which its gate insulation film, gate electrode, and side wall spacers are removed therefrom. In the drawings of FIGS. 6A to 6C, the numerals and symbols of components and so on associated with the N-type MOS transistor are shown in parentheses. FIGS. 7A to 7E are schematic cross-sectional views showing the method of manufacturing the CMOS transistor according to the second embodiment in the order of processes, each view corresponding to a schematic cross section along an x-y plane shown in FIGS. 6A to 6C. Note that the same numerals and symbols are shown for the components and so on corresponding to those in the first embodiment for convenience of explanation.

Figure 7A:
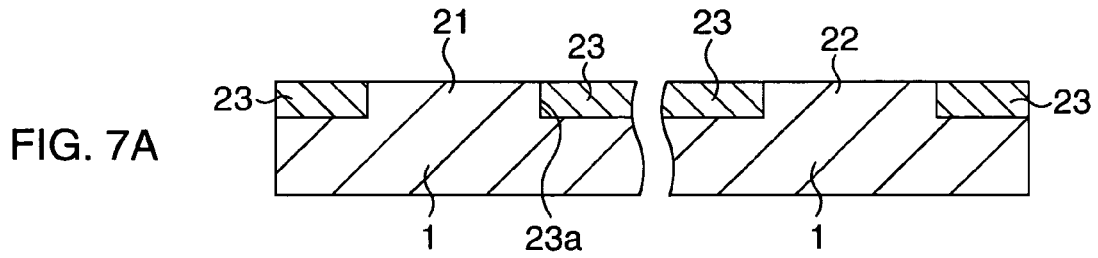
FIGS. 7A to 7E are schematic cross-sectional views showing a method of manufacturing the CMOS transistor according to the second embodiment in the order of processes.

First, as shown in FIG. 6A and FIG. 7A, on a silicon substrate 1, an active region 21 of the P-type MOS transistor and an active region 22 of the N-type MOS transistor are defined, respectively.

More specifically, element isolation structures are formed respectively within the element isolation region for the P-type MOS transistor and the element isolation region for the N-type MOS transistor on a semiconductor substrate, that is, the silicon substrate 1, so as to define the active regions 21 and 22. As the element isolation structures, the STI method is used to fill grooves 23a which are formed within the element isolation regions by lithography and dry etching, with an insulation material such as a silicon oxide or the like, and then, for example, the CMP (Chemical Mechanical Polishing) method is used to polish for flattening the surface of the insulation material to form STI element isolation structures 23.

In this embodiment, the groove 23a is formed in a shape in which each of the active regions 21 and 22 has protruding portions 21a or 22a protruding from a pair of side faces of a rectangle, in other words in an almost cross shape, and an insulation material is embedded in the groove 23a and flattened to form the STI element isolation structure 23.

Figure 7B:
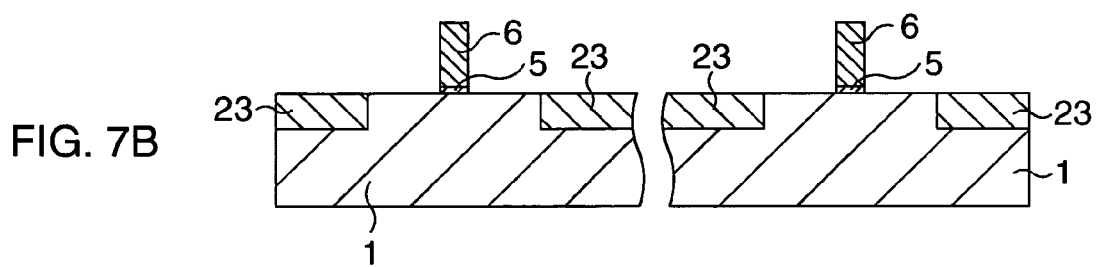

Subsequently, as shown in FIG. 7B, gate electrodes 6 are pattern-formed in a shape extending along tops of the protruding portions 21a and 22a above the active regions 21 and 22 via gate insulation films 5.

More specifically, first, the gate insulation film 5 having a film thickness of about 1 nm made of, for example, a silicon oxide film is formed on the active regions 21 and 22 by, for example, the thermal oxidation method.

Next, a polycrystalline silicon film (not shown) is deposited to have a film thickness of about 100 nm on the entire surface including the gate insulation film 5 by, for example, the CVD method. Then, the polycrystalline silicon film and the gate insulation film 5 are patterned by the lithography and the dry etching, thereby pattern-forming the gate electrodes 6 extending along tops of the respective protruding portions 21a and 22a above the active regions 21 and 22 via the gate insulation films 5, respectively.

Note that it is also preferable to form the gate electrodes 6 on a condition that when the gate electrodes 6 are formed, the gate electrodes 6 relieve the compression stress applied to the portions which will become the active regions 21 and 22 or apply expansion stress to the portions. For example, when the polycrystalline silicon film becoming the gate electrodes 6 is formed, it is formed at a temperature of, for example, 700° C. to 1000° C., for example, 850° C. The formation of the gate electrodes 6 in the above manner relieves the compression stress applied to the portions becoming the channel regions (or applies expansion stress to the portions), thereby further contributing to the improvement in the on-current.

Figure 7C:
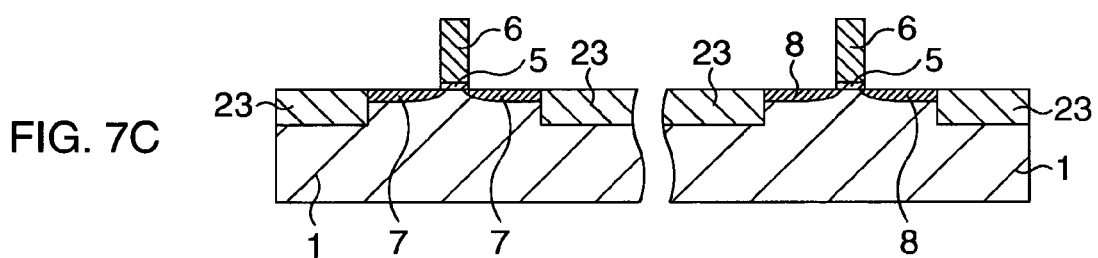

Subsequently, as shown in FIG. 7C, extension regions 7 and extension regions 8 are formed within the active regions 21 of the P-MOS transistor and the active region 22 of the N-type MOS transistor, respectively.

More specifically, first, a resist mask (not shown) is formed which covers only the active region 22 side, and ion implantation of P-type impurities, boron (B) here is performed to the active region 21 on a condition of an acceleration energy of 1 keV and a dose amount of $1 \times 10^{15}/cm^2$. During the implantation, the P-type extension regions 7 are formed on both sides of the gate electrode 6 with the gate electrode 6 serving as a mask within the active region 21.

Next, after the resist mask is removed by ashing or the like, a resist mask (not shown) is formed which covers only the active region 21 side. Then, using this resist mask, ion implantation of N-type impurities, phosphor (P) here is performed to the active region 22 on a condition of an acceleration energy of 1 keV and a dose amount of $2 \times 10^{15}/cm^2$. During the implantation, the N-type extension regions 8 are formed on both sides of the gate electrode 6 with the gate electrode 6 serving as a mask within the active region 22. The resist mask is then removed by ashing or the like.

Figure 7D:
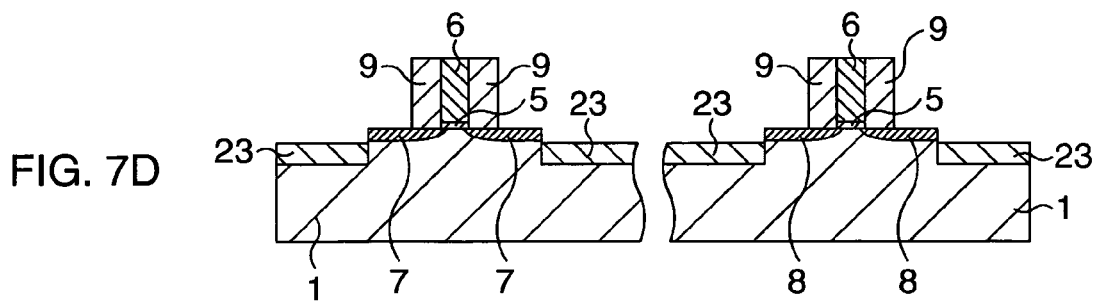

Subsequently, as shown in FIG. 7D, side wall spacers 9 are formed on both side faces of each of the gate electrodes 6.

More specifically, an insulation film, a silicon oxide film (not shown) here is deposited on the entire surface to cover the gate electrodes 6. Anisotropic etching (etch back) is then performed for the entire surface of the silicon oxide film to leave the silicon oxide film only on both side faces of the gate electrodes 6, thereby forming the side wall spacers 9, respectively.

The surface layer of the STI element isolation structures 23 is etched here except for portions under the gate electrodes 6 and the side wall spacers 9, mainly due to the entire surface anisotropic etching at the time of formation of the side wall spacers 9.

Figure 7E:
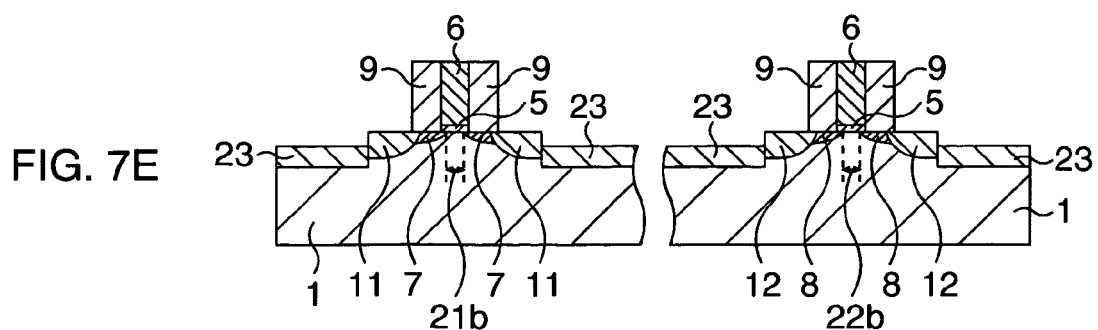

Subsequently, as shown in FIG. 7E and FIG. 6B, source/drain regions 11 and source/drain regions 12 are formed within the active region 21 of the P-type MOS transistor and the active region 22 of the N-type MOS transistor, respectively.

More specifically, first, a resist mask (not shown) is formed which covers the active region 22 side, and ion implantation of P-type impurities, boron (B) here is performed to the active region 21 on a condition of an acceleration energy of 40 keV and a dose amount of $5\times10^{15}/cm^2$. During the implantation, the P-type source/drain regions 11 which are deeper than the extension regions 7 are formed, in a manner to partially overlap with the P-type extension regions 7 on both sides of the side wall spacers 9, with the gate electrode 6 and the side wall spaces 9 serving as a mask within the active region 21.

Next, after the resist mask is removed by ashing or the like, a resist mask (not shown) is formed which covers the active region 21 side. Using this resist mask, ion implantation of N-type impurities, phosphor (P) here is performed to the active region 22 on a condition of an acceleration energy of 40 keV and a dose amount of $5\times10^{15}/cm^2$. During the implantation, the N-type source/drain regions 12 which are deeper than the extension regions 8 are formed, in a manner to partially overlap with the N-type extension regions 8 on both sides of the side wall spacers 9, with the gate electrode 6 and the side wall spaces 9 serving as a mask within the active region 22.

Then, after the resist mask is removed by ashing or the like, annealing processing is performed for the silicon substrate 1 at 1050° C. for about 10 seconds. This annealing processing activates the various impurities ion-implanted for the formation of the extension regions 7 and 8 and the source/drain regions 11 and 12.

Thereafter, through formation of an interlayer insulation film, various connection holes, wirings and so on, a CMOS transistor including the P-type MOS transistor within the active region 21 and the N-type MOS transistor within the active region 22 is completed, respectively.

In this embodiment, as shown in FIG. 6B and 6C, the rectangular region between the source/drain regions 11 except the protruding portions 21a becomes a channel region 21b within the active region 21, and the rectangular region between the source/drains 12 except the protruding portions 22a becomes a channel region 22b within the active region 22. Each of the channel regions 21b and 22b is separated from a remaining portion 23a of the insulation material of the STI element isolation structure 23 by the protruding portion 21a or 22a by the amount thereof and is thus brought into a so-called non-contact state with the remaining portion 23a. Accordingly, the compression stress in the z-direction applied to of each of the channel region 21a and 22b by the STI element isolation structure 23 is reduced. Further, an increase in the width (in gate-width direction) of the active region 21 and 22 by the amount of the protruding portions 21a and 22a relieves the gate-width direction dependence, resulting in increased on-current as shown in the characteristic diagram in FIG. 8. This configuration can prevent a decrease in the on-current both in the P-type and the N-type MOS transistors with very little gate-width direction dependence as well as irrespective of the conduction type thereof.

As described above, according to this embodiment, it is possible to significantly reduce the gate-width direction dependence of the stress and relieve the stress applied to the active regions easily and surely, without causing an increase in processes and complication of processes in a CMOS transistor having the STI element isolation structures 23, so as to realize a reliable CMOS transistor having excellent current characteristics.

Note that, in the second embodiment, it is also preferable to add a process as in the modification example of the first embodiment to relieve the stress of the STI element isolation structure 4 by introduction of Ge or the like.

According to the present invention, it is possible to significantly reduce the gate-width direction dependence of the stress and relieve the stress applied to the active regions easily and surely, without causing an increase in processes and complication of processes in a semiconductor device including the STI element isolation structure, so as to realize a reliable semiconductor device having excellent current characteristics.

What is claimed is:

1. A semiconductor device, comprising:
   an element isolation structure formed by embedding an insulation material in a groove formed within an element isolation region of a semiconductor substrate;
   an active region defined in the semiconductor substrate by said element isolation structure;
   a gate electrode pattern-formed above said active region via a gate insulation film; and
   a transistor structure having a pair of impurity diffused layers formed within said active region on both sides of said gate electrode,
   wherein surface layers of said active region are formed so as to protrude said element isolation structure, and said surface layers have a channel region constituting a substantial current passing region formed between each impurity diffused layer, and
   wherein said element isolation structure is in a non-contact state with at least both side faces along a gate-length direction of a channel region within said surface layers.

2. The semiconductor device according to claim 1, wherein said gate electrode is formed to cover said channel region from a top face to both side faces thereof via said gate insulation film.

3. The semiconductor device according to claim 1, wherein:
   said active region has a pair of protruding portions protruding back and forth in a gate-width direction from said channel region; and
   said protruding portions separate said channel region from said element isolation structure in the gate-width direction.

4. The semiconductor device according to claim 1, wherein said gate electrode is formed to apply an expansion strain to said channel region.

5. The semiconductor device according to claim 1, wherein:
   implantation of an element and annealing processing are performed to at least portions of said element isolation structure in contact with end faces parallel to the gate length of said active region,
   so that a compression stress in the gate-width direction to said active region by said element isolation structure is relieved.

6. The semiconductor device according to claim 1, wherein,
   said transistor structure of an N-type in which said impurity diffused layers are formed by introduction of N-type impurities and said transistor structure of a P-type in which said impurity diffused layers are formed by introduction of P-type impurities, are formed on the same semiconductor substrate.

* * * * *